(12) United States Patent
Aisu et al.

(10) Patent No.: US 9,478,568 B2
(45) Date of Patent: Oct. 25, 2016

(54) PHOTOELECTRIC CONVERSION DEVICE HAVING TWO SWITCH ELEMENTS

(71) Applicants: Katsuhiko Aisu, Hyogo (JP); Takaaki Negoro, Osaka (JP); Kazuhiro Yoneda, Osaka (JP); Katsuyuki Sakurano, Hyogo (JP); Hirofumi Watanabe, Hyogo (JP)

(72) Inventors: Katsuhiko Aisu, Hyogo (JP); Takaaki Negoro, Osaka (JP); Kazuhiro Yoneda, Osaka (JP); Katsuyuki Sakurano, Hyogo (JP); Hirofumi Watanabe, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 55 days.

(21) Appl. No.: 14/305,821

(22) Filed: Jun. 16, 2014

(65) Prior Publication Data

US 2014/0367550 A1 Dec. 18, 2014

(30) Foreign Application Priority Data

Jun. 17, 2013 (JP) ................................. 2013-126640

(51) Int. Cl.
*H01L 27/144* (2006.01)
*H01L 27/146* (2006.01)
*H04N 5/359* (2011.01)
*H04N 5/374* (2011.01)
*H04N 5/3745* (2011.01)

(52) U.S. Cl.
CPC ....... *H01L 27/144* (2013.01); *H01L 27/14609* (2013.01); *H04N 5/359* (2013.01); *H04N 5/374* (2013.01); *H04N 5/3745* (2013.01)

(58) Field of Classification Search
CPC .......... H01L 27/144; H01L 27/14609; H04N 5/359; H04N 5/374; H04N 5/3745
See application file for complete search history.

(56) References Cited

U.S. PATENT DOCUMENTS

2012/0099010 A1\* 4/2012 Sugiyama ......... H01L 27/14609
348/294

\* cited by examiner

*Primary Examiner* — Francis M Legasse, Jr.

(74) *Attorney, Agent, or Firm* — Oblon, McClelland, Maier & Neustadt, L.L.P (57) ABSTRACT

A photoelectric conversion device includes a first output line, a second output line; and a photoelectric conversion cell. The photoelectric conversion cell further includes, a photoelectric conversion element configured to generate an output current corresponding to an intensity of incident light, a first switch element configured to transmit the first output current to the first output line according to a first control signal, and a second switch element configured to transmit the second output current to second output line according to a second control signal. As a result, the photoelectric conversion device can be provided to generate rapidly the image data with wide dynamic range without the need for complex control outside of the photoelectric conversion device.

7 Claims, 9 Drawing Sheets

FIG. 1

IMAGE SIGNAL

PHOTOELECTRIC CONVERSION DEVICE HAVING TWO SWITCH ELEMENTS

CROSS REFERENCE TO RELATED APPLICATIONS

The present application claims the benefit of priority under 35 U.S.C. from Japanese Patent Application No. 2013-126640 filed on Jun. 17, 2013. The entire contents of Japanese Patent Application No. 2013-126640 are incorporated herein by reference.

BACKGROUND

1. Field

The present invention relates to improved photoelectric conversion device to convert optical information as optical intensity and wavelength and so on, and an optical image, into current, charge, voltage, or electric information including digital data, as well as to photoelectric conversion cells, photoelectric converter arrays comprised of the photoelectric conversion cells as the photoelectric conversion device and imaging devices incorporating such an array.

2. Background of the Related Art

A photoelectric conversion device using a photodiode (for example, CMOS image sensors), accumulates electric charges generated (converted) from incident light in a junction capacitance of photodiodes, and takes the electric charge out as electric signals.

However, when a strong light strikes the photodiode, and therefore the converted charge exceeds the amount of charge that can be accumulated in the junction capacitance, a dynamic range of incident light that can be detected is limited.

For example, shooting a plurality of images by changing the time irradiated with light or the time for accumulating the electric charges generated (converted) by light and synthesizing the image shots, is known as a technique for obtaining an image that is not saturated from weak light/strong light (that is, techniques for expanding the dynamic range).

Further, there is a technique to speed up the operation of the photoelectric conversion device for converting incident light into an electric signal.

The photoelectric conversion device includes a phototransistor having an amplifying function, a recharging switch connected to the phototransistor, and a reading switch connected to the phototransistor. By the recharging switch, the phototransistor is connected to an output terminal during one or more clock times after reading (that is, the recharging switch has reset function of the photoelectric conversion device). An electrode of the read switch is connected to the phototransistor, and another electrode is connected to the output terminal. The electric signal is output from the output terminal. In this case, the above configuration removes an after-image and therefore a high-speed operation of the photoelectric conversion device can be provided.

SUMMARY

In an aspect of the disclosure, there is provided photoelectric conversion device. A photoelectric conversion device includes a first output line; a second output line; and a photoelectric conversion cell. The photoelectric conversion cell further includes, a photoelectric conversion element to generate an output current corresponding to an intensity of incident light, a first switch element to transmit the first output current to the first output line according to a first control signal, and a second switch element to transmit the second output current to second output line according to a second control signal.

As a result, the photoelectric conversion device can be provided to generate rapidly the image data with wide dynamic range without the need for complex control outside of the photoelectric conversion device.

DETAILED DESCRIPTION OF THE PREFERRED EMBODIMENTS

Figure 1:
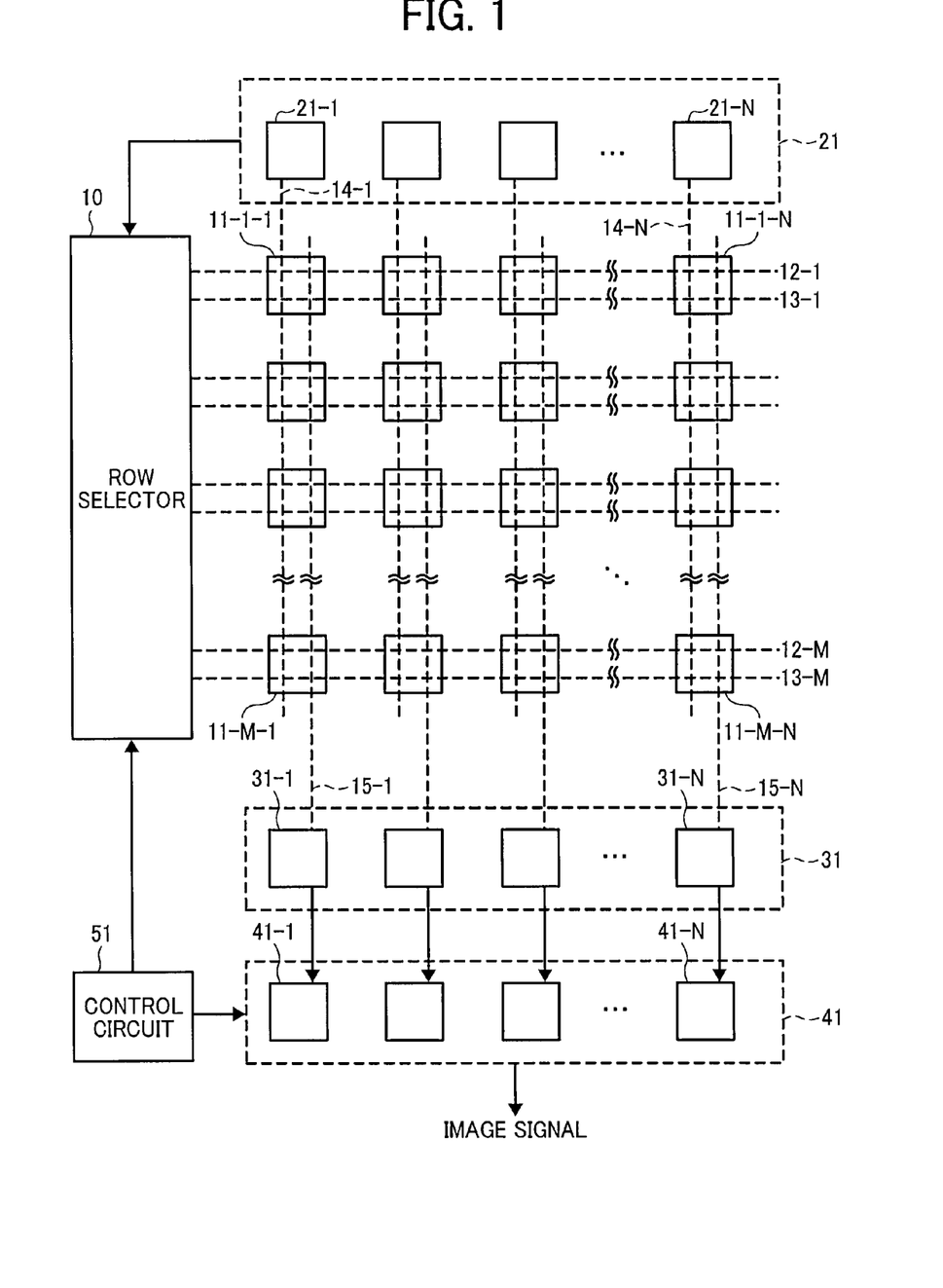
FIG. 1 is a block diagram showing the configuration of a photoelectric conversion device according to an embodiment.

FIG. 1 is a block diagram showing the configuration of a photoelectric conversion device according to an embodiment. The photoelectric conversion device includes a plurality of photoelectric conversion cells 11-1-1~11-M-N (pixel cells) arranged in a two-dimensional array form, a plurality of row control lines 12-1~12-M, 13-1~13-M, a plurality of column output lines 14-1~14N, 15-1~15-N, a row selector 10, a current sink circuit 21, an IV conversion circuit 31, an AD converter 41, and a control circuit 51.

Each of the photoelectric conversion cells 11-1-1~11-M-N includes a photoelectric conversion element such as phototransistor that generates an output current having a magnitude corresponding to the intensity of an incident light, etc.

The row control lines 12-$m$, 13-$m$ ($1 \leq m \leq M$) are connected to N cells (the photoelectric conversion cells, the pixel cells) 11-$m$-1~11-$m$-N, respectively. The column control lines 14-$n$, 15-$n$ ($1 \leq n \leq N$) are connected to M cells (the photoelectric conversion cells, the pixel cells) 11-M-1~11-M-n, respectively.

A row selector 10 transmits a control signal to the photoelectric conversion cells (the pixel cell)

11-*m*-1~11-*m*-N via the row control lines 12-*m*, 13-*m* (1≤m≤M), that is, the row selector 10 operates as a control device of the photoelectric conversion cells.

The row selector 10 selects sequentially the M cells 11-1-*n*~11-M-n (1≤n≤N) (the photoelectric conversion cells, pixel cells) of each column. A current output from the selected cell of each column is transmitted to the IV converter 31-*n* via the column output line 15-*n*.

An output current from the remaining cells is transmitted to the current sink 21-*n* via the column output line 14-*n*, or is not transmitted to any of the current sink 21-*n* and the IV converter 31-*n*.

The current sink circuit 21 includes a current sink 21-1~21-N that is connected to the column output line 14-1~14N, respectively. All the current on each column output line 14-1~14-N flows into the corresponding current sink 21-1~21-N.

The IV conversion circuit 31 includes an IV converter 31-1~31-N connected respectively to column output line 15-1~15-N.

The IV converter 31-1~31-N operates as a current(I)-to-voltage(V) converting means for converting the output current of the cell to the output voltage.

The AD converter 41 receives the output voltage of the IV converter 31-1~31-N. The AD converter 41 generates an image signal by performing analog to digital conversion on the output voltage of IV converter 31-1~31-N.

The control circuit 51 controls the AD converter 41 and the row selector 10 so as to be synchronized with each other.

Figure 2:
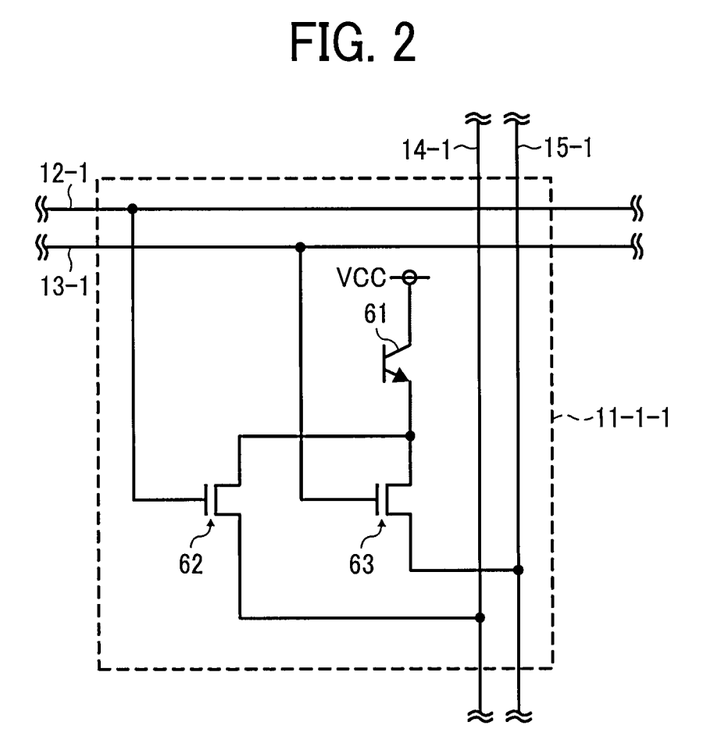
FIG. 2 is a diagram showing a photoelectric conversion cell 11-1-1 of FIG. 1.

FIG. 2 is a circuit diagram showing a detailed configuration of a photoelectric conversion cell 11-1-1 in FIG. 1.

The photoelectric conversion cell 11-1-1 includes a phototransistor 61, a first switching element 62, and a second switching element 63.

A collector of the phototransistor 61 is connected to a voltage source VCC. An emitter of the phototransistor 61 is connected to the column output line 14-1 through the first switching element 62, and to the column output line 15 via the second switching element 63.

When the first switch element 62 is closed in response to a control signal sent via the row control lines 12-1 by the row selector 10, the output current of the photo transistor 61 flows to the current sink 21 via the column output line 14-1.

When the second switch element 63 is closed in response to a control signal sent via the row control lines 13-1 by the row selector 10, the output current of the phototransistor 61 flows to the IV converter 31-1 via the column output line 15-1.

According to conventional technology, typically, a pixel cell (a photoelectric conversion cell) of a CMOS image sensor converts charges accumulated in the photodiode by the incident light to a voltage, and outputs the voltage through the source follower circuit configured to one or more MOS transistor.

A pixel cell (a photoelectric conversion cell) of a CCD image sensor also outputs by transferring charges accumulated in the photodiode by the incident light.

Both the CMOS image sensor and the CCD image sensor generate an output signal by using the charge accumulated in the photodiode. However, the dynamic range of the image sensors is about four orders of magnitude, since there is a limit to the amount of charge that can be accumulated in the photodiode.

On the other hand, it is possible to generate an output current that varies linearly with incident light having a dynamic range of 6 orders of magnitude by using an image sensor including a phototransistor according to an embodiment, since the phototransistor has a wider dynamic range than the photodiode.

Thus, the phototransistor 41 in the photoelectric conversion cell 11-1-1 in FIG. 2 produces an output current having a wide dynamic range.

Assuming that the first switching element 62 is not provided in FIG. 2, when opening the switching device 63, charges generated by incident light are stored in the base of the phototransistor 61, and the output current of the phototransistor 61 does not flow to the column output lines 15-1. Therefore, the emitter potential and/or the base potential of the photo transistor 61 at opening of the second switch element 63 has a different value as compared to the emitter potential and/or the base potential at closing of the second switch element 63.

Thereafter, after closing the switch element 63, the current flowing through the column output line 15-1 is directed to a stable state via a transient state that the current temporarily increased, because the emitter potential and/or the base potential has a difference between opening and closing of the second switch element 63. The time the current flowing through the column output line 15-1 completes to stabilize depends on the time of the charging and discharging of the parasitic capacitance of the emitter and the parasitic capacitance of the base of the phototransistor 61.

The length of this time increases in proportion to the magnitude of the difference between the emitter potential and/or the base potential of the phototransistor 61 at opening the second switching element 63, and the emitter potential and/or the base potential of the phototransistor 61 when the current through the column output line 15-1 reaches a stable state after closing the switching element 63.

On the other hand, in the embodiment, the photoelectric conversion cell 11-1-1 has the first switching element 62 and the second switching element 63 as shown in FIG. 2, and operates as follows.

When the photoelectric conversion cell 11-1-1 is selected by row selector 10, the first switch element 62 is opened, the second switch element 63 is closed and the output current of the phototransistor 61 is transmitted to the IV converter 31-1 via the column output line 15-1. Specifically, the first switch element 62 remains closed during a predetermined period of time, and immediately after the first switch element 62 is opened (for example, after from a few nanoseconds to about 0.1 microsecond), the second switching element 63 is closed.

The time to keep the switching device 62 closed (the predetermined period of time) is set based on the length of a time that charges accumulated in the base of the phototransistor 61 is sent to the current sink 21-1 through the column output line 14-1.

When the photoelectric conversion cell 11-1-1 is not selected, the switch element 62 is closed, and the switch element 63 is opened, the output current of the photo transistor 61 flows to current sink 21-1 through the column output line 14-1.

The first switching device 62 is closed when the time of zero or more has passed after opening the second switch element 63. However, it is necessary to close the first switching element 62 before next closing the second switching element 63.

When the potentials of the column output lines 14-1, 15-1 are respectively set to be the same, the emitter potential and the base potential of the photo transistor 61 does not change (it remains constant) whether or not the photoelectric conversion cell 11-1-1 is selected.

The first switch element 62 is kept open until just before closing the second switching element 63.

The charge generated by the incident light is accumulated in the base of the phototransistor 61. For example, when there is no switching device 62 as described above, the emitter potential and/or the base potential of the phototransistor 61 at opening of the second switch element 63 has a different value as compared to the emitter potential and/or the base potential at closing the second switch element 63.

In this case, it takes a long time for the current flowing through the row output line 15-1 when closing the second switch element 63 to become stable. However, in the photoelectric conversion cell 11-1-1 in FIG. 2, by providing a settling time for closing the first switching element 62 (that is, the predetermined period of time described above), it is possible to speed up the operation of the photoelectric conversion device.

All the photoelectric conversion cells other than the cell 11-1-1 are configured similarly to the cell 11-1-1 shown in FIG. 2.

According to the photoelectric conversion device of FIG. 1, for example, for an image generating apparatus including the photoelectric conversion device, the photoelectric conversion device can be provided to rapidly generate the image data with wide dynamic range without the need for complex control outside of the photoelectric conversion device.

According to the photoelectric conversion device of FIG. 1, the photoelectric conversion element having an amplification function in the phototransistor 61 is used to generate a large output current to some extent and has an effect of being able to reduce the noise of a subsequent circuit (outside of the photoelectric conversion device) even when the incident light is weak.

Next, with reference to FIGS. 3-7, a detailed configuration of the current sink circuit 21 of FIG. 1 is described.

Figure 3:
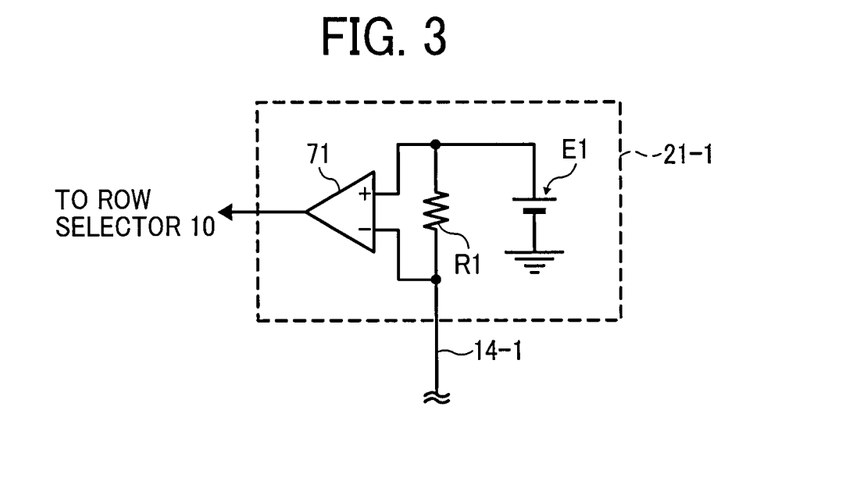
FIG. 3 is a diagram showing a current sink 21-1 of FIG. 1.

FIG. 3 is a circuit diagram showing a detailed configuration of the current sink 21-1 in FIG. 1. The current sink 21-1 includes a voltage source E1, a resistor R1, and an operational amplifier 71, and has a current limit function.

The voltage source E1 has a low bias voltage value determined in advance (for example, a ground (0V) or voltage 1V). Thus, the sum of the output current of each photoelectric conversion cell not selected by the row selector 10 flows into the current sink 21-1 through the column output line 14-1.

The current flowing through the column output lines 14-1 does not contribute to the image signal outputted from the photoelectric conversion device. Therefore the current flowing through the column output lines 14-1 should be as small as possible, for reducing the power consumption.

The operational amplifier 71 monitors an amount of current flowing through the column output line 14-1 by using the resistor R1, and transmits the result of the monitoring to the row selector 10.

The row selector 10 generates a control signal to open the first switch element 62 of each of the cells 11-1-1~11-M-N when the current flowing through the column output line 14-1 exceeds a predetermined threshold value. The other current sinks 21-2~21-N of FIG. 1 are configured in the same manner as the current sink 21-1 shown in FIG. 3.

The row selector 10 generates a control signal to open the first switch element 62 of each the cells 11-1-1~11-M-N when any of the current sinks 21-1~21-N detects (determines) that the current flowing through the column output line 14-1 exceeds a predetermined threshold value.

Figure 4:
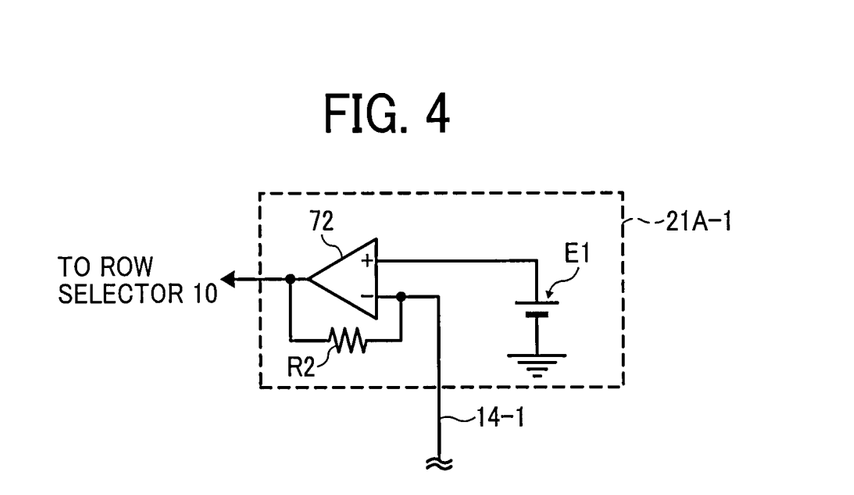
FIG. 4 is a diagram showing a modified current sink 21A-1.

FIG. 4 is a diagram showing a modified current sink 21A-1.

A current sink 21A-1 includes a voltage source E1, resistor R2, and an operational amplifier 72, and has a current limiting function. Using the current sink 21A-1 in FIG. 4, the potential of the column output line 14-1 is not affected by the magnitude of the current flowing through the column output line 14-1.

In other points, the current sink 21A-1 operates similarly to the current sink 21-1 in FIG. 1.

Figure 5:
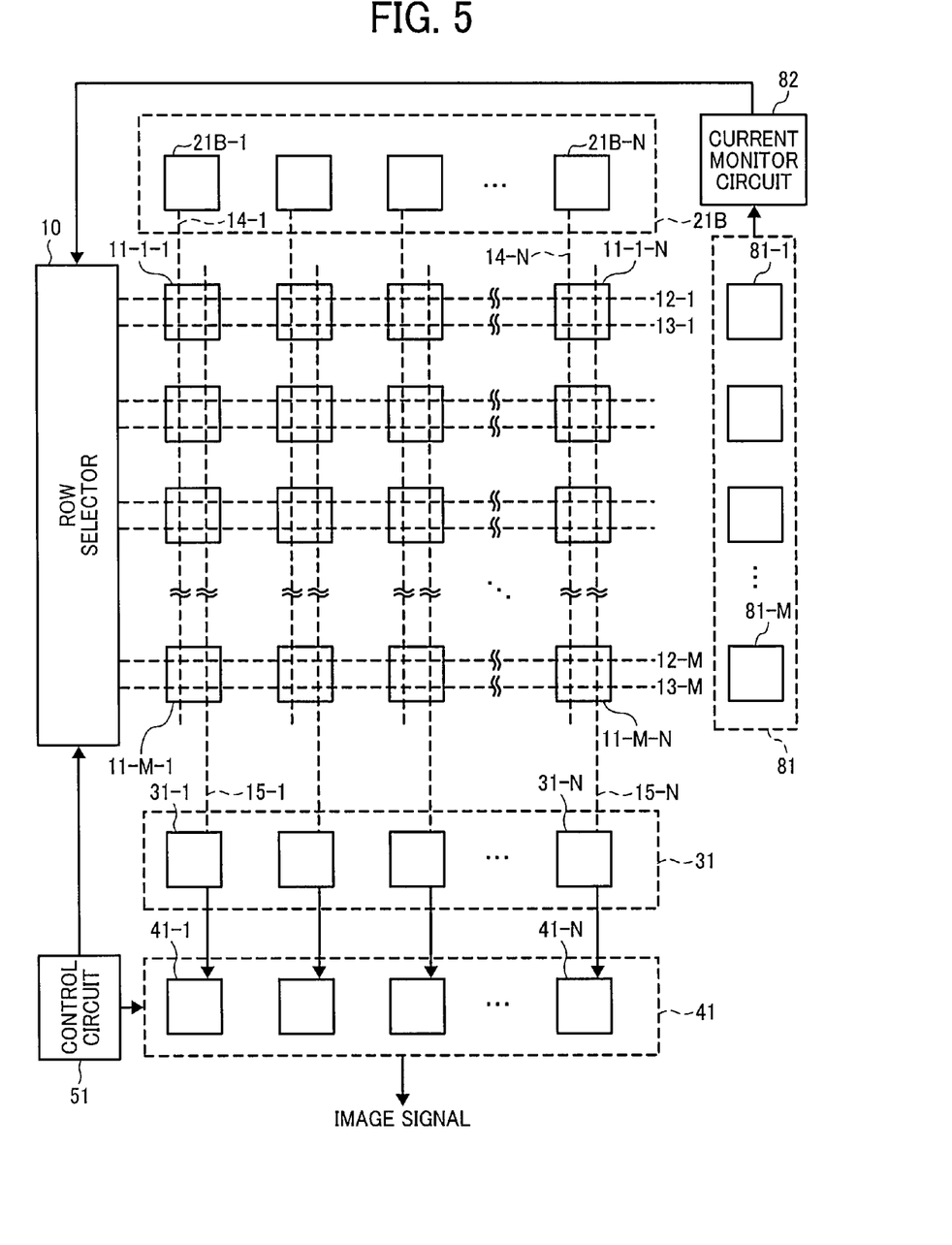
FIG. 5 is a block diagram showing the configuration of a first modified photoelectric conversion device.

FIG. 5 is a block diagram showing the configuration of a first modified photoelectric conversion device. The photoelectric conversion device of FIG. 5 includes a current sink circuit 21B in place of the current sink circuit 21 of FIG. 1.

For example, the current sink circuit 21B includes a current sink 21B-1~21B-N each comprised of only the voltage source E1 in FIG. 3. The photoelectric conversion device of FIG. 5 further includes a current monitor circuit 82 and a dummy photoelectric conversion array 81.

The dummy photoelectric conversion array 81 includes at least one dummy photoelectric conversion cell 81-1~81-M for generating an output current having a magnitude corresponding to the intensity of the incident light.

When a large output current is generated by the dummy photoelectric conversion cell 81-1~81-M, a large current is flowing to 14-1~14-N column output line in the same manner. It is desirable to limit the amount of the current flowing through the column output line in the same way as FIGS. 3 and 4. A current monitoring circuit 82 monitors the magnitude of the output current generated by each dummy photoelectric conversion cell 81-1~81-M, and transmits the result of monitoring to the row selector 10. When intensity of the incident light exceeds the predetermined threshold, the row selector generates a control signal to open the first switch element 62 of each photoelectric conversion cells 11-1-1~11-M-N.

Figure 6:
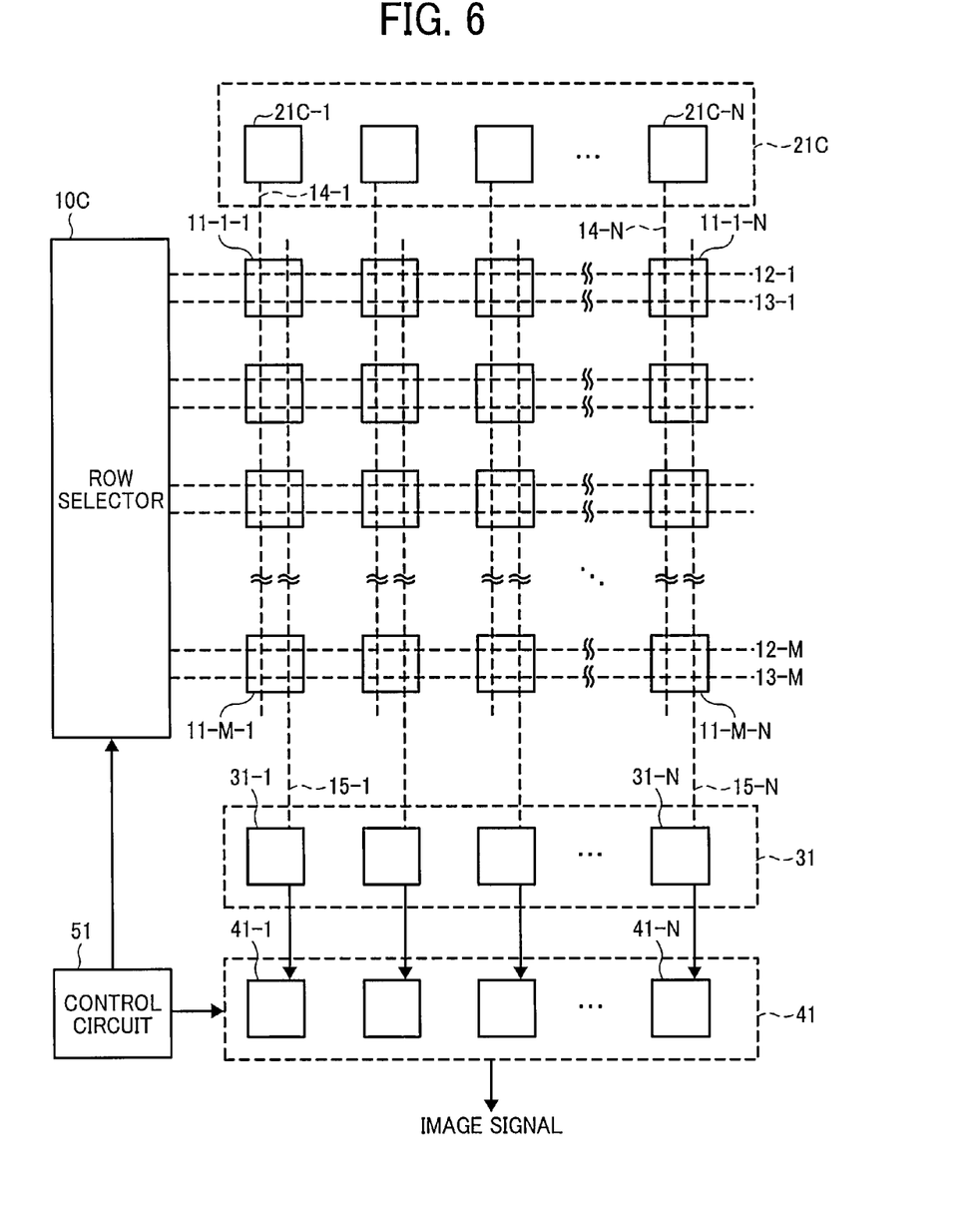
FIG. 6 is a block diagram showing the configuration of a second modified photoelectric conversion device.
Figure 7:
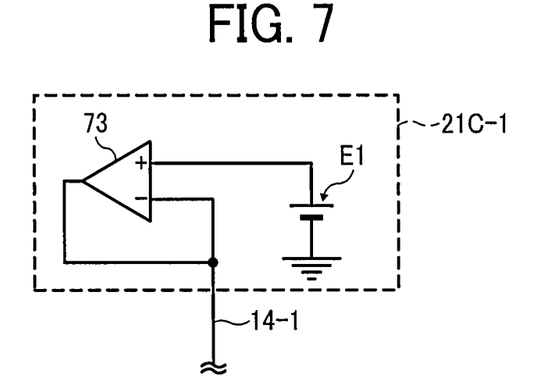
FIG. 7 is a diagram showing a modified current sink 21C-1 of FIG. 6.

FIG. 6 is a block diagram showing the structure of a photovoltaic device according to a second modification of the embodiment. FIG. 7 is a circuit diagram showing a detailed configuration of the current sink 21C-1 in FIG. 6. The photoelectric conversion device of FIG. 6 comprises a current sink circuit 21C instead of the current sink circuit 21 of FIG. 1. The current sink 21C-1 in FIG. 7 includes an operational amplifier 73 and voltage source E1, and has a function of limiting a flowing current to a predetermined threshold value (for example, 10 μA). Before the current flow to the column output line 14-1 exceeds the threshold, the potential of the column output line 14-1 rises, as a result, there is no possibility that such current flows.

The current sink 21C-2~21C-N of FIG. 6 is configured in the same manner as the current sink 21C-1 in FIG. 7.

According to FIGS. 3 and 4, when any of current sinks 21-1~21-N detect that the magnitude of the current flowing through the column output line 14-1~14-N exceeds the threshold value, all the first switch elements 62 of 11-1-1~11-M-N of the photoelectric conversion cell are opened. According to FIG. 5, it is possible to provide dummy cells 81-1~81-M for each row of the photoelectric conversion cells 11-1-1~11-M-N.

In this case, when the intensity of the incident light exceeds a threshold value in any of the dummy cells 81-1~81-M, only the first switch elements 62 in the row corresponding to the dummy cell are opened.

According to FIG. 6, when one of the current sinks 21C-1~21C-N detects that the magnitude of the current flowing through the column output line 14-1~14-N exceeds a threshold value, the current sink opens only the first switch elements 62 of the cells connected to the column output line that the current sink detected.

According to FIGS. 3-5, as described above, to limit the amount of current flowing through the column output line 14-1~14-N, the row selector 10 generates a control signal to open the first switch element 62 of each cells 11-1-1~11-M-N.

Further, the row selector 10 also can increase or decrease the length of the settling time to keep closing the first switch elements 62 of each photoelectric conversion cell 11-1-1~11-M-N, according to the magnitude of the current flowing through the column output line 14-1~14-N or the intensity of incident light.

When the switch element 62 of each of the photoelectric conversion cells 11-1-1~11-M-N is opened by the current limiting function shown in FIGS. 3-7, the switch element 62 of 11-1-1~11-M-N, is likely to have an insufficient length of the settling time to close. When the length of the settling time is insufficient, the charge generated by the incident light is accumulated in the base of the phototransistor 61.

However, since the output current of the phototransistor 61 is increased when the intensity of incident light is high, the period of time that the current flowing through the column output lines 15-1 after closing the switching element 63 is stabilized, and is shorter than the time when the intensity of incident light is low.

Thus, the reduction in the operating speed of the photoelectric conversion device by the current limiting function is limited.

It is possible to set the threshold of the current limit in FIGS. 3-7 according to what should be prioritized, the speed of operation of the photoelectric conversion device or the reduction of the power consumption.

Next, with reference to FIGS. 8-13, the detailed configurations of the IV conversion circuit 31 of FIG. 1 and the modified IV conversion circuits are described.

Figure 8:
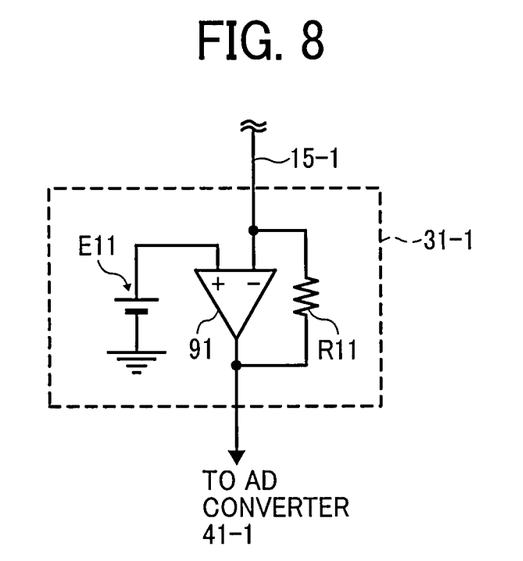
FIG. 8 is a diagram showing an IV converter 31-1 of FIG. 1.

FIG. 8 is the detailed configuration of the IV converter 31-1 of FIG. 1. The IV converter of FIG. 8 includes a voltage source E11, a resistor R11, and an operational amplifier 91.

The voltage source E11 has same voltage value as the bias voltage of the voltage source E1 of the current sink 21-1 connected to the column output line 14-1 corresponding to the column output line 15-1 (for example, a ground (0V) or voltage 1V).

The IV converter 31-1 is a negative feedback circuit, and the potential of the column output line 15-1 is controlled to be constant by said circuit.

If the voltage source E11 of the IV converter 31-1 and the voltage source E1 of the current sink 21-1 have the same voltage value, the base potential and/or the emitter voltage of the phototransistor 61 does not change (remains constant) whether or not the photoelectric conversion cell 11-1-1 is selected.

Figure 9:
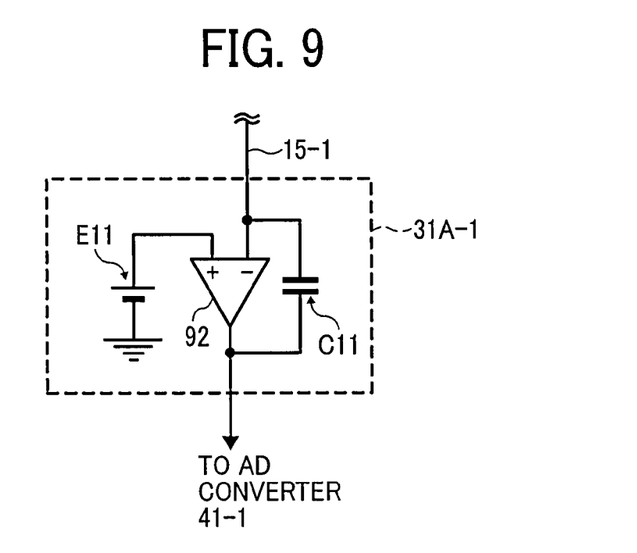
FIG. 9 is a diagram showing a first modified IV converter 31A-1.

FIG. 9 is a detailed configuration of a first modified IV converter 31A-1. The IV converter 31A-1 includes the voltage source E11, a capacitor C11, and an operational amplifier 92. The IV converter 31A-1 operates as an integrator circuit.

Figure 10:
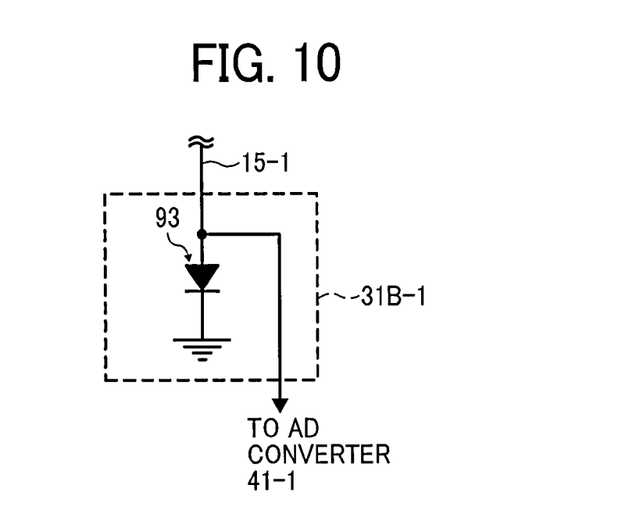
FIG. 10 is a diagram showing a second modified IV converter 31B-1.
Figure 11:
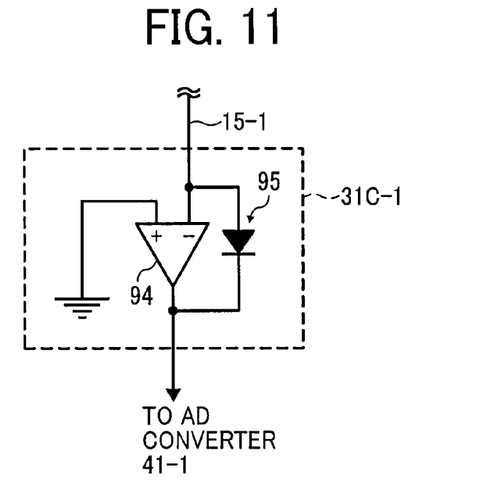
FIG. 11 is a diagram showing a third modified IV converter 31C-1.

FIG. 10 is a detailed configuration of a second modified IV converter 31B-1. FIG. 11 is a detailed configuration of a third modified IV converter 31C-1.

Figure 12:
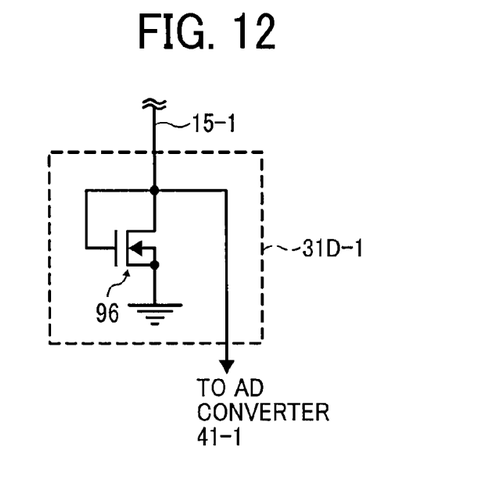
FIG. 12 is a diagram showing a fourth modified IV converter 31D-1.
Figure 13:
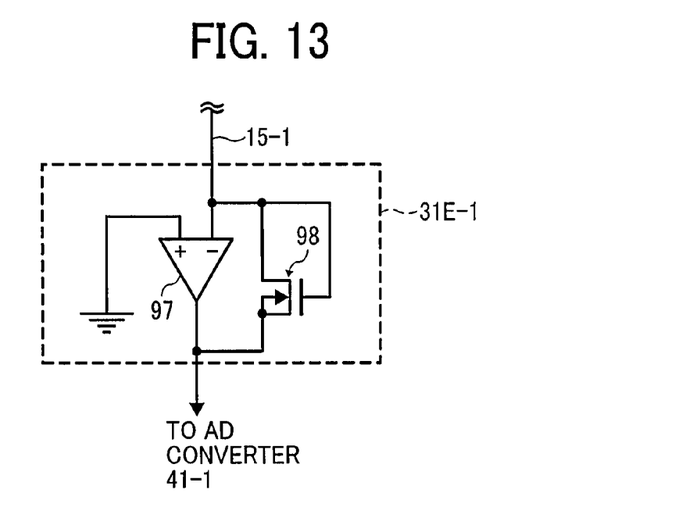
FIG. 13 is a diagram showing a fifth modified IV converter 31E-1.

FIG. 12 is a detailed configuration of a fourth modified IV converter 31D-1. FIG. 13 is a detailed configuration of a fifth modified IV converter 31E-1.

The IV converter 31B-1 in FIG. 10 has a diode 93. The IV converter 31C-1 of FIG. 11 includes an operational amplifier 94 and a diode 95.

The IV converter 31D-1 of FIG. 12 includes a MOS transistor 96. The IV converter 31E-1 in FIG. 13 includes a MOS transistor 98 and operational amplifier 97. As the IV converters in FIGS. 10-13 include non-linear elements (diode, transistor, etc.), the IV converters can have the conversion characteristics determined by the characteristic values of the nonlinear element.

The IV conversion circuit may include an IV converter other than the IV converter described above and convert an output current of the cells to a voltage.

The IV converters 31-2~31-N in FIG. 1 are also configured similarly to the IV converters 31-1, 31A-1~31E-1 in FIGS. 8 to 13.

Each AD converter 41-$n$ (1≤n≤N) may perform sampling of the output voltage of the IV converter 31-$n$ at several times when one of the 11-M-n image cells 11-1-$n$~the M corresponding to the AD converter, but it is selected.

For example, the AD converter 41-$n$ performs sampling the output voltage of the IV converter 31-$n$ before and after closing the second switching element 63 of the photoelectric conversion cells, and before and after opening the second switch element 63 of the photoelectric conversion cells.

By utilizing the value to calculate the difference between the two sampling results, it is possible to cancel noise and error generated in the AD converters 41-$n$ and/or the IV converter 31-$n$.

Figure 14:
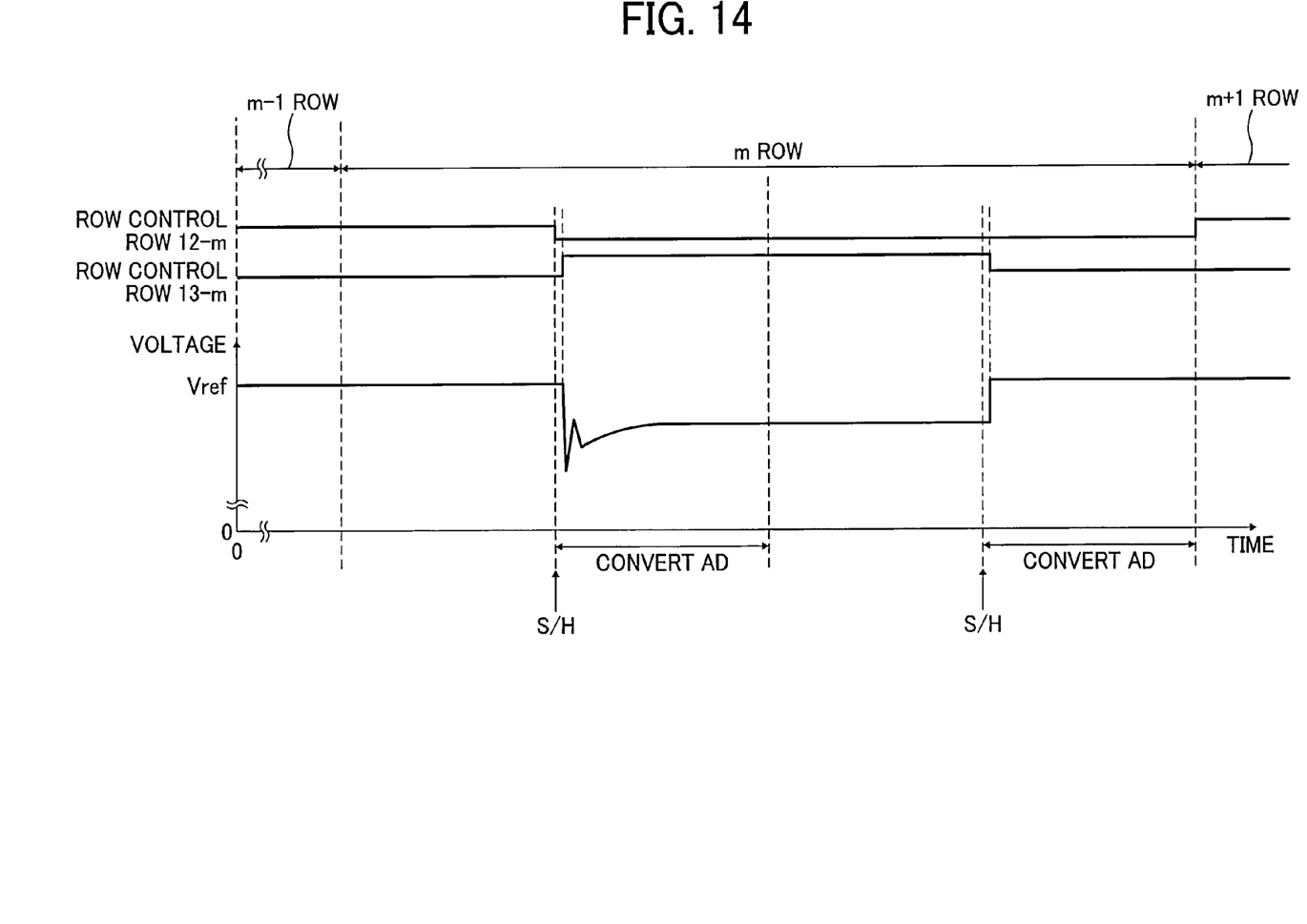
FIG. 14 is a timing chart showing typical operation of the photoelectric conversion of FIG. 1.

FIG. 14 is a timing chart showing an exemplary operation of the photoelectric conversion device of FIG. 1. Specifically, the timing chart shows the operation of the photoelectric conversion cell 11-$m$-$n$ of the m-th row, when the M photoelectric conversion cells 11-1-$n$-11-M-n connected to the column output line 15-$n$ (1≤n≤N) are selected sequentially. For example, the number of rows M is 1080.

If the switching elements 62, 63 are, for example, an n-type MOSFET, the switching elements 62, 63 are opened when the control signals on the row control lines 12-$m$, 13-$m$ (1≤m≤M) are at low level, and the switching elements 62, 63 are closed when the control signals on the row control lines 12-$m$, 13-$m$ (1≤m≤M) are at a high level. If the switch elements 62, 63 are a p-type MOSFET, the relationship between the opening/closing of the switching elements 62, 63 and the high/Low level of the control signals is opposite to that of the n type MOSFET. In the time interval assigned to the photoelectric conversion cell 11-$m$-$n$ (for example, 20 microseconds), at its initial state, the switch element 62 is closed, and the switch element 63 is opened.

When starting a first sampling (that is, a first "S/H" of FIG. 14), the first switch element 62 is opened, immediately thereafter (as described above, for example, after from few nanoseconds to 0.1 microseconds), the second switch element 63 is closed. Over a period of time before and after closing the second switching element 63, AD converter 41-$n$ performs the AD conversion on the output voltage of the IV converter 31-$n$. Thereafter, when starting the second sampling (that is, a second "S/H" of FIG. 14), the second switch element 63 is opened.

Over a period of time before and after opening the switch elements 63, the AD converter 41-$n$ performs the AD conversion on the output voltage of the IV converter 31-$n$.

A timing that the first switch element 62 is closed after the second switch element 63 is opened can be to set arbitrarily as long as before closing the second switch element 63 again.

According to the exemplary embodiment described above, the photoelectric conversion device can be provided to generate rapidly the image data with wide dynamic range by using a photoelectric conversion element including the phototransistor for generating the output current having a magnitude corresponding to the intensity of the incident light.

When the charge generated by incident light is not stored in the phototransistor, and the output current having a magnitude corresponding to the intensity of the incident light is always generated, the output current of the phototransistor has a linear characteristic with respect to incident light with wide dynamic range.

On the other hand, if the charge generated by incident light is accumulated in the phototransistor (or the photodiode), the phototransistor (or photodiode) has a narrow range showing the linear characteristics with respect to incident light for an upper limit to the charge to be accumulated. Therefore, if there is a potential difference between "the base potential and/or emitter potential of the photo transistor before closing the switching elements of the photoelectric conversion cell" and "the base potential and/or emitter potential of the phototransistor after closing the switching elements of the photoelectric conversion cell", it takes time to reach a stable state after closing the switching elements of the photoelectric conversion cell.

In particular, for being stable of the base potential, it is necessary either to charge the parasitic capacitance of the base in the charges generated by incident light, or to discharge the parasitic capacitance in the base current multiplying 1/hFE to the output current (the "hFE" (Hybrid Forward Emitter) is a technical term to describe the current gain of a transistor.)

Thus if the intensity of the incident light is low, it takes a long time for the base potential to become stable.

The photoelectric conversion cell of FIG. 2, by providing the two switching elements 62, 63, the emitter potential and/or the base potential of the phototransistor when the second switching element 63 is opened can have same state as the emitter potential and/or the base potential of the phototransistor when the second switch element 63 is closed. Thus, when the switch element 63 is closed, it is possible to shorten the time to reach the stable state since the emitter and/or the base potential of the phototransistor 61 is not changed.

The present invention is not limited to the embodiment and the modification described above.

One current sink can be arranged for one each column output line, or it is possible to share one current sink between two or more column output lines.

One IV converter also may be arranged for each output line column, or it is possible to share the single IV converter between two or more column output lines. In the latter case, it is necessary to add a function of selecting the column output line to the single IV converter.

One AD converter may be arranged for each IV converter, and arranged AD converters, or it is possible to share the single AD converter between the output voltages of two or more IV converters by time division multiplexing.

By utilizing the photoelectric conversion device according to the embodiment and the modifications described above, it is possible to provide an image generating device such as sensor devices, imaging devices, office equipment, and scientific instruments.

According to the present invention, a photoelectric conversion device includes a first output line; a second output line; and a photoelectric conversion cell; the photoelectric conversion cell further includes, a photoelectric conversion element to generate an output current corresponding to an intensity of incident light, a first switch element to transmit the first output current to the first output line according to a first control signal, and a second switch element to transmit the second output current to second output line according to a second control signal.

A photoelectric conversion device further includes a control circuit to control the first control signal and the second control signal, wherein the control circuit to control so that the first switch element keeps to be closed during a predetermined period of time and thereafter the first switch element is opened by using the first control signal, and the second switch element is closed by using the second control signal after the first switch element is opened.

A photoelectric conversion device further includes a dummy photoelectric conversion cell for generating an dummy output current having a magnitude corresponding to the intensity of the incident light, wherein the control circuit to generate the first control signal opening the first switch when the dummy output signal exceeds a predetermined value.

A photoelectric conversion device, further includes a current sink circuit to input the first output current of the photoelectric conversion element via the first output line.

A photoelectric conversion device further includes a control circuit to control the first control signal and the second control signal, wherein the current sink circuit monitors the first output current, and the control circuit generates the first signal opening the first switch element when the monitored first output signal is over a predetermined value, wherein the current sink circuit has a function of limiting the amount of the first output current to a predetermined threshold value.

A photoelectric conversion device further includes an IV converter circuit to convert the second output current of the photoelectric conversion cell to a voltage.

A photoelectric conversion device, wherein a plurality of the photoelectric conversion cells is arranged in a two-dimensional array.

We claim:
1. A photoelectric conversion device, comprising:
a first output line;
a second output line;
a photoelectric conversion cell electrically connected to at least one of the first output line and the second output line;
a control circuit configured to control a first control signal and a second control signal; and
a dummy photoelectric conversion cell configured to generate a dummy output current having a magnitude corresponding to the intensity of the incident light,
wherein the control circuit is configured to generate the first control signal to open a first switch when the dummy output signal exceeds a predetermined value; and
wherein the photoelectric conversion cell includes
a photoelectric conversion element configured to generate an output current corresponding to an intensity of incident light,
the first switch element configured to transmit the first output current to the first output line according to the first control signal, and
a second switch element configured to transmit the second output current to second output line according to the second control signal.

2. The photoelectric conversion device of claim 1, further comprising:
an IV converter circuit configured to convert the second output current of the photoelectric conversion cell to a voltage.

3. The photoelectric conversion device of claim 1, wherein a plurality of the photoelectric conversion cells is arranged in a two-dimensional array.

4. A photoelectric conversion device, comprising:
a first output line;
a second output line;
a photoelectric conversion cell electrically connected to at least one of the first output line and the second output line;
a current sink circuit configured to input the first output current of the photoelectric conversion element via the first output line; and
a control circuit configured to control a first control signal and a second control signal,
wherein the current sink circuit monitors the first output current, and the control circuit generates the first signal opening a first switch element when the monitored first output signal is over a predetermined value; and
wherein the photoelectric conversion cell includes
a photoelectric conversion element configured to generate an output current corresponding to an intensity of incident light,
the first switch element configured to transmit the first output current to the first output line according to the first control signal, and
a second switch element configured to transmit the second output current to second output line according to the second control signal.

5. The photoelectric conversion device of claim 4, wherein the current sink circuit has a function of limiting the amount of the first output current to a predetermined threshold value.

6. The photoelectric conversion device of claim 4, further comprising:
an IV converter circuit configured to convert the second output current of the photoelectric conversion cell to a voltage.

7. The photoelectric conversion device of claim 4, wherein a plurality of the photoelectric conversion cells is arranged in a two-dimensional array.

* * * * *